United States Patent
Tabata et al.

[11] Patent Number: 5,793,945
[45] Date of Patent: Aug. 11, 1998

[54] METHOD AND DEVICE FOR INITIAL-DIAGNOSING PROCESSORS

[75] Inventors: Takeo Tabata; Akiko Sato; Kazuhiro Yuuki; Akihiro Yamazaki; Naoki Izuta, all of Kanagawa, Japan

[73] Assignee: Fujitsu Limited, Kawasaki, Japan

[21] Appl. No.: 533,650

[22] Filed: Sep. 25, 1995

[30] Foreign Application Priority Data

Mar. 20, 1995 [JP] Japan ..................... 7-061140

[51] Int. Cl.⁶ ..................... G06F 15/16
[52] U.S. Cl. ..................... 395/183.01
[58] Field of Search ............ 395/183.01, 183.07, 395/183.12, 403, 412, 444, 445, 446, 447, 448, 449; 364/500, 551.01, 243.44, 243.45, 267; 324/537; 370/241; 711/3, 118, 119, 120, 121, 122, 202

[56] References Cited

U.S. PATENT DOCUMENTS

| | | | |
|---|---|---|---|
| 5,210,861 | 5/1993 | Shimoda | 395/575 |
| 5,327,435 | 7/1994 | Warchol | 371/16.1 |
| 5,355,471 | 10/1994 | Weight | 395/575 |
| 5,396,619 | 3/1995 | Walton | 395/183.01 |
| 5,406,504 | 4/1995 | Denisco et al. | 364/580 |
| 5,522,046 | 5/1996 | McMillen et al. | 395/200.15 |
| 5,524,208 | 6/1996 | Finch et al. | 395/183.01 |
| 5,586,279 | 12/1996 | Pardo et al. | 395/403 |
| 5,638,382 | 6/1997 | Krick et al. | 371/22.5 |

OTHER PUBLICATIONS

Janssens et al., "The Performance of Cache-Based Error Recovery in Multiprocessors", IEEE Trans. on Parallel and Distrib. Sys., Oct. 1994, pp. 1033-1043.

*Primary Examiner*—Robert W. Beausoliel, Jr.
*Assistant Examiner*—Stephen C. Elmore
*Attorney, Agent, or Firm*—Staas & Halsey

[57] ABSTRACT

A device for the initial-diagnosing of processors is provided with a processor module, a storage unit, an address allocation unit and a diagnostic execution unit. The processor module has a processor and a cache storage unit. The storage unit stores an initial diagnostic setting program which diagnoses the processor and the cache storage unit. The address allocation unit allocates the addresses of the processor by making the addresses of the processor correspond to the addresses of the cache storage unit so that the cache storage unit is accessed by the processor. The diagnostic execution unit reads the initial diagnostic setting program stored in the storage unit into the addresses of the cache storage unit allocated by the address allocation unit, and executes the initial diagnostic setting program.

8 Claims, 8 Drawing Sheets

FIG. 4

| ADDRESSES OF PROCESSOR | ADDRESSES OF CACHE MEMORY |
|---|---|
| AD1 | AD1 |
| AD2 | AD2 |
| AD3 | AD3 |
| AD4 | AD4 |
| ⋮ | ⋮ |
| ADn | ADn |

METHOD AND DEVICE FOR INITIAL-DIAGNOSING PROCESSORS

BACKGROUND OF THE INVENTION

The present invention relates to a method and a device for the initial-diagnosing of processors which executes an initial-diagnosis of processors in a multiprocessor system for parallel processing through a common bus.

In recent years, the market has demanded a highly efficient data base retrieval in an information processing and a parallel processing of picture processing in a technological field. A multiprocessor system having a plurality of connected processor has been provided so as to cope with the demand. The multiprocessor system executes the parallel processing by combining a plurality of processor modules comprising a processor and a memory through a common bus.

The multiprocessor system disperses and arranges the memories for groups of more than one processor. The dispersed memory is accessed by each of the processors in the group. The multiprocessor system executes the parallel processing with a plurality of processors by reducing a load against the common bus. Further, a multiprocessor system having a dispersed common memory which can be accessed directly by the mutual processors through the common bus also exists.

Sometimes, one of processor modules is abnormal in the multiprocessor system having the above-mentioned dispersed common memory. For this reason, each of the processors must be diagnosed as to whether the processor module is normal by executing an initial diagnostic setting program.

In this case, a power supply has been inputted, and each of the processors has been diagnosing the processor module by executing an initial diagnostic setting program stored in a read-only-memory (ROM) as the dispersed common memory connected to the common bus.

However, the load of the common bus rises when the initial diagnostic setting program stored in ROM is executed by a plurality of processors. For this reason, the processing speed is deteriorated.

A known method for initial-diagnosing processors is shown. First of all, the power supply is inputted (Step 1001), and a main storage memory is diagnosed and set by the processor by using the first initial diagnostic setting program (Step 1002).

After that, a cache memory is diagnosed and set by the second initial diagnostic setting program stored in ROM (Step 1003), and the third initial diagnostic setting program stored in the ROM is developed into the main storage (Step 1004).

Then, a cache controller is actuated, and the cache controller loads the third initial diagnostic setting program on a cache memory from the main storage memory (Step 1005). The processor has been executing the third initial diagnostic setting program on the cache memory (Step 1006).

However, the access speed of ROM is slow, and the above-mentioned initial diagnostic setting program is executed on ROM. It takes more time to process the program when a large scale integrated circuit (LSI) stands between the ROM and the processor module. For this reason, the time required for executing the initial diagnostic setting program on the ROM is larger than the time required for executing the program existing on the main storage memory and the cache memory.

As mentioned hereinbefore, it is necessary to diagnose and set the main storage memory and the cache memory, when the initial diagnostic setting program has been executed in the main storage memory and the cache memory. It takes a considerable time to diagnose and set the main storage memory, since the initial diagnostic setting for the main storage memory is executed by the initial diagnostic setting program in ROM.

SUMMARY OF THE INVENTION

An object of the present invention is to provide a method and a device for the initial-diagnosing of processors which make it possible to increase an execution speed of an initial diagnostic setting program.

The first invention comprises a processor module, a storage unit, an address allocation unit and a diagnostic execution unit.

The processor module has a processor and a cache storage unit connected to the processor, and is connected to a common bus. The storage unit stores an initial diagnostic setting program which diagnoses the processor and the cache storage unit, and is connected to the common bus.

The address allocation unit allocates the addresses of the processor by making the addresses of the processor correspond to the addresses of the cache storage unit so that the cache storage unit is accessed by the processor. Hereupon, the address allocation unit also can be installed within the processor.

The diagnostic execution unit reads the initial diagnostic setting program stored in the storage unit into the addresses of the cache storage unit allocated by the address allocation unit and executes the initial diagnostic setting program. The diagnostic execution unit also can be installed within the processor.

The first invention also can be formed, even if the following additional components are added to it.

The additional components further comprise a main storage unit for storing the initial diagnostic setting program and a cache control unit for reading the initial diagnostic setting program stored in the main storage unit into the cache storage unit. The diagnostic execution unit diagnoses and sets the main storage unit by using the initial diagnostic setting program stored in the storage unit, reads the initial diagnostic setting program stored in the storage unit into the main storage unit, and diagnoses the processor by actuating the cache control unit by using the initial diagnostic setting program stored in the cache storage unit.

The second invention comprises a plurality of processor modules, a storage unit, a plurality of address allocation units and a plurality of diagnostic execution units.

Each of the plurality of processor modules has a processor and a cache storage unit connected to the processor, and is connected to a common bus.

The storage unit stores an initial diagnostic setting program which diagnoses the processor and the cache storage unit within the plurality of processor modules, and is connected to the common bus.

The plurality of address allocation units are provided corresponding to the plurality of processor modules and allocates the addresses of the processor by making the addresses of the processor correspond to the addresses of the cache storage unit so that the cache storage unit is accessed by the processor.

The plurality of diagnostic execution units are provided corresponding to the plurality of processor modules, reads the initial diagnostic setting program stored in the storage unit into the addresses of the cache storage unit allocated by the address allocation unit, and executes the initial diagnostic setting program.

Further, the second invention can be provided with a main storage unit for storing the initial diagnostic setting program and a plurality of cache control units which are provided corresponding to the processor modules, reads the initial diagnostic setting program stored in the main storage unit into the cache storage unit.

One diagnostic execution means of the plurality of diagnostic execution units reads the initial diagnostic setting program stored in the storage unit into the main storage unit after diagnosing and setting the main storage unit by using the initial diagnostic setting program stored in the cache storage unit, and actuates the cache control unit corresponding to the one diagnostic execution unit and transmits a designation for actuating the cache control unit corresponding to the remaining all the diagnostic execution units to the remaining all the diagnostic execution units.

The third invention comprises a storage step, an address allocation step and a diagnostic execution step.

The storage step stores an initial diagnostic setting program which diagnoses a processor and a cache storage unit installed on a processor module.

The address allocation step allocates the addresses of the processor by making the addresses of the processor correspond to the addresses of the cache storage unit so that the cache storage unit is accessed by the processor.

The diagnostic execution step reads the initial diagnostic setting program stored in the storage unit into the addresses of the cache storage unit allocated by the address allocation step and executes the initial diagnostic setting program.

Further, the diagnostic execution step diagnoses and sets main storage unit by using the initial diagnostic setting program stored in the cache storage unit, reads the initial diagnostic setting program stored in the storage unit into the main storage unit, and actuates cache control unit for reading the initial diagnostic setting program stored in the main storage means into the cache storage means.

The fourth invention comprises a storage step, an address allocation step and a diagnostic execution step.

The storage step stores an initial diagnostic setting program which diagnoses a processor and a cache storage unit installed on each of the plurality of processor modules.

The address allocation step allocates the addresses of the processor by making the addresses of the processor correspond to the addresses of the cache storage means by using a plurality of address allocation units corresponding to the plurality of processor modules so that the cache storage means is accessed by the processor.

The diagnostic execution step reads the initial-diagnostic setting program stored in the storage unit into the addresses of the cache storage unit allocated by the address allocation step by using a plurality of diagnostic execution units corresponding to the plurality of processor modules, and executes the initial diagnostic setting program.

Further, the fourth invention can be provided with a cache control step for reading the initial diagnostic setting program stored in the main storage unit into the cache storage unit by using a plurality of cache control units which were provided corresponding to the plurality of processor modules.

In the diagnostic execution step, one diagnostic execution unit of the plurality of diagnostic execution units reads the initial diagnostic setting program stored in the storage unit into the main storage unit after diagnosing and setting the main storage unit using the initial diagnostic setting program stored in the cache storage unit. The diagnostic execution unit then actuates the cache control unit corresponding to the one diagnostic execution unit and transmits to the remaining diagnostic execution units a designation for actuating the cache control unit corresponding to the remaining diagnostic execution units.

According to the present invention, when the address allocation unit allocates the addresses of the processor by making the addresses of the processor correspond to the addresses of the cache storage unit, the diagnostic execution unit reads the initial diagnostic setting program stored in the storage unit into the addresses of the cache storage unit allocated by the address allocation unit, and executes the initial diagnostic setting program. Accordingly, the processes can be executed at a high speed. Deterioration of performance due to competition in the common bus does not occur, since the cache storage unit within the processor module is accessed by the processor.

Further, the processing speed in which the diagnostic execution unit diagnoses and sets the main storage unit by using the initial diagnostic setting program stored in the cache storage unit will be faster than the processing speed in which the diagnostic execution unit diagnoses and sets the main storage unit by using the initial diagnostic setting program stored in the storage unit.

The operation when a plurality of processors are connected to the common bus will be the same as those of the single processor.

Hereupon, one diagnostic execution unit diagnoses and sets the main storage unit by using the initial diagnostic setting program stored in the cache storage unit, reads the initial diagnostic setting program stored in the storage unit into the main storage unit, actuates one cache control unit and transmits an designation for actuating the cache control unit to the remaining all diagnostic execution units. Accordingly, the diagnostic execution units do not load the common buses until the designation reaches the remaining all diagnostic execution units.

BRIEF DESCRIPTION OF THE DRAWINGS

FIG. 4 is a diagram indicating a construction of a known address allocation unit.

DETAILED DESCRIPTION OF THE PREFERRED EMBODIMENTS

Figure 1:
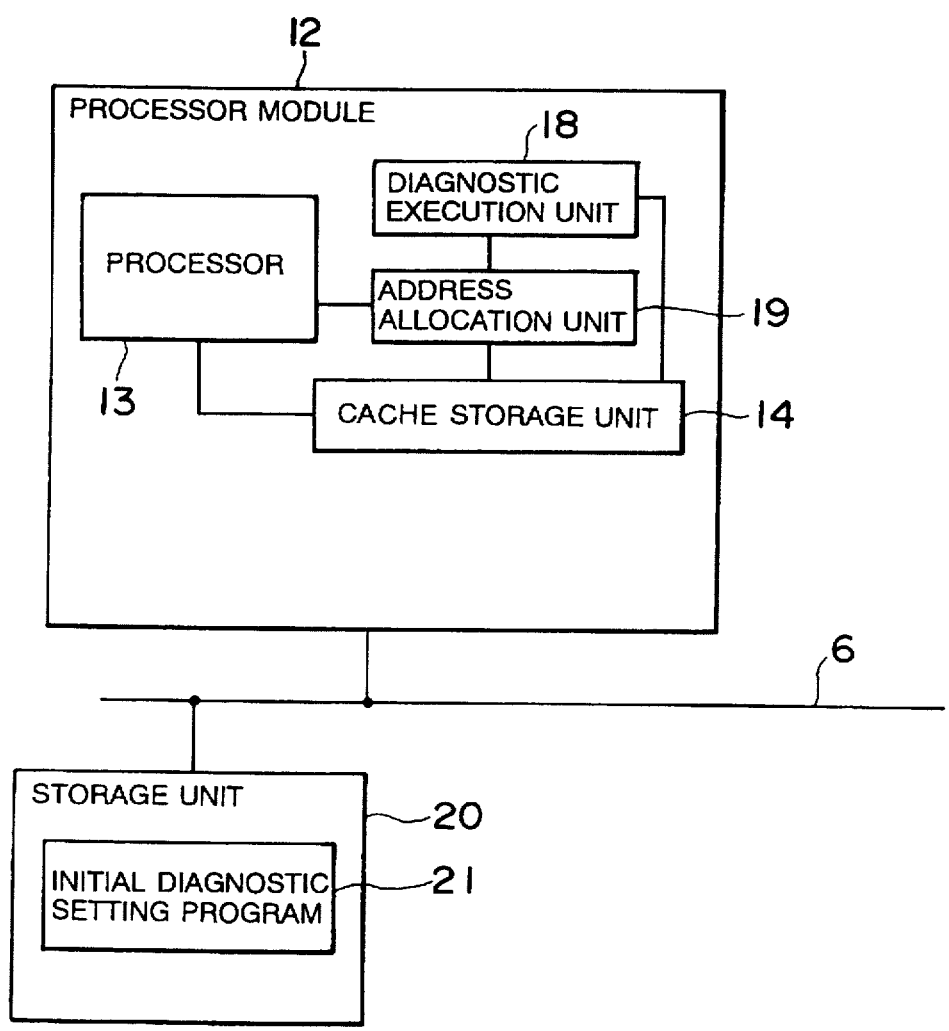
FIG. 1 is a block diagram of a device for the initial-diagnosing of processor in accordance with the first embodiment of the present invention.

The embodiments of the device and method for the initial-diagnosing of processors of the present invention will be described by referring to the drawings as follows.

<EMBODIMENT 1>

As shown in FIG. 1, the device for the initial-diagnosing of processors comprises a processor module 12 connected to a common bus 6 and a storage unit 20 connected to the common bus 6.

The processor module 12 comprises a processor 13, a cache storage unit 14 connected to the processor 13, an address allocation unit 19 connected to the processor 13 and the cache storage unit 14 and a diagnostic execution unit 18 connected to the address allocation unit 19 and the cache storage unit 14.

The cache storage unit 14 is a cache memory whose capacity is small and which can be written and read at a high speed and so on.

The storage unit 20 stores an initial diagnostic setting program 21 which diagnoses the processor 13 and the cache storage unit 14. The storage unit 20 is, for instance, a ROM, a hard disk, a magnetic disk and so on.

The address allocation unit 19 allocates the addresses of the processor 13 by making the addresses of the processor 13 correspond to the addresses of the cache storage unit 14 so that the cache storage unit 14 is accessed by the processor 13.

The diagnostic execution unit 18 reads the initial-diagnostic setting program 21 stored in the storage unit 20 into the addresses of the cache storage unit 14 allocated by the address allocation unit 19, and executes the initial diagnostic setting program 21.

Figure 2:
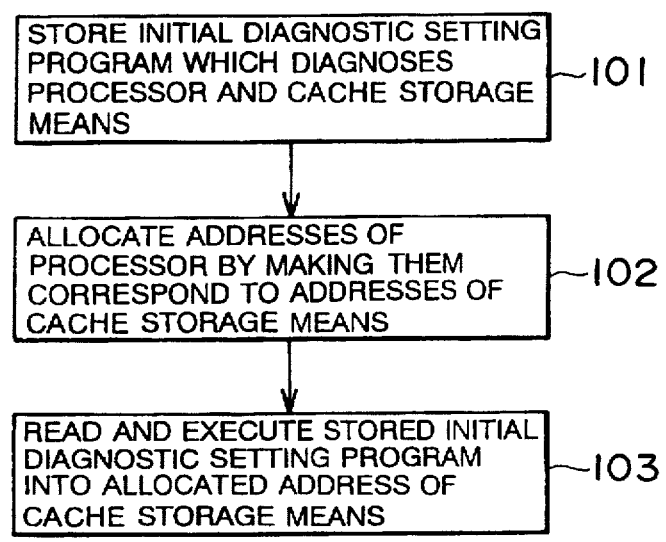
FIG. 2 is a flowchart indicating a method for the initial-diagnosing of processors in accordance with the first embodiment of the present invention.

Then, the method for the initial-diagnosing of processors of the first embodiment constructed in the above-mentioned way will be described in accordance with the flowchart shown in FIG. 2.

First of all, the storage unit 20 stores the initial diagnostic setting program which diagnoses the processor 13 and the cache storage unit 14 (Step 101).

Then, the address allocation unit 19 allocates the addresses of the processor 13 by making the addresses of the processor 13 correspond to the addresses of the cache storage unit 14 (Step 102).

Further, the diagnostic execution unit 18 reads the initial diagnostic setting program 21 stored in the storage unit 20 into the addresses of the cache storage unit 14 allocated by the address allocation unit 19, and executes the initial diagnostic setting program 21 (Step 103).

Accordingly, the processes can be executed at a high speed. Besides, the deterioration of performance due to competition in the common bus 6 does not occur, since the cache storage unit 14 within the processor module 12 is accessed by the processor 13.

<EMBODIMENT 2>

Figure 3:
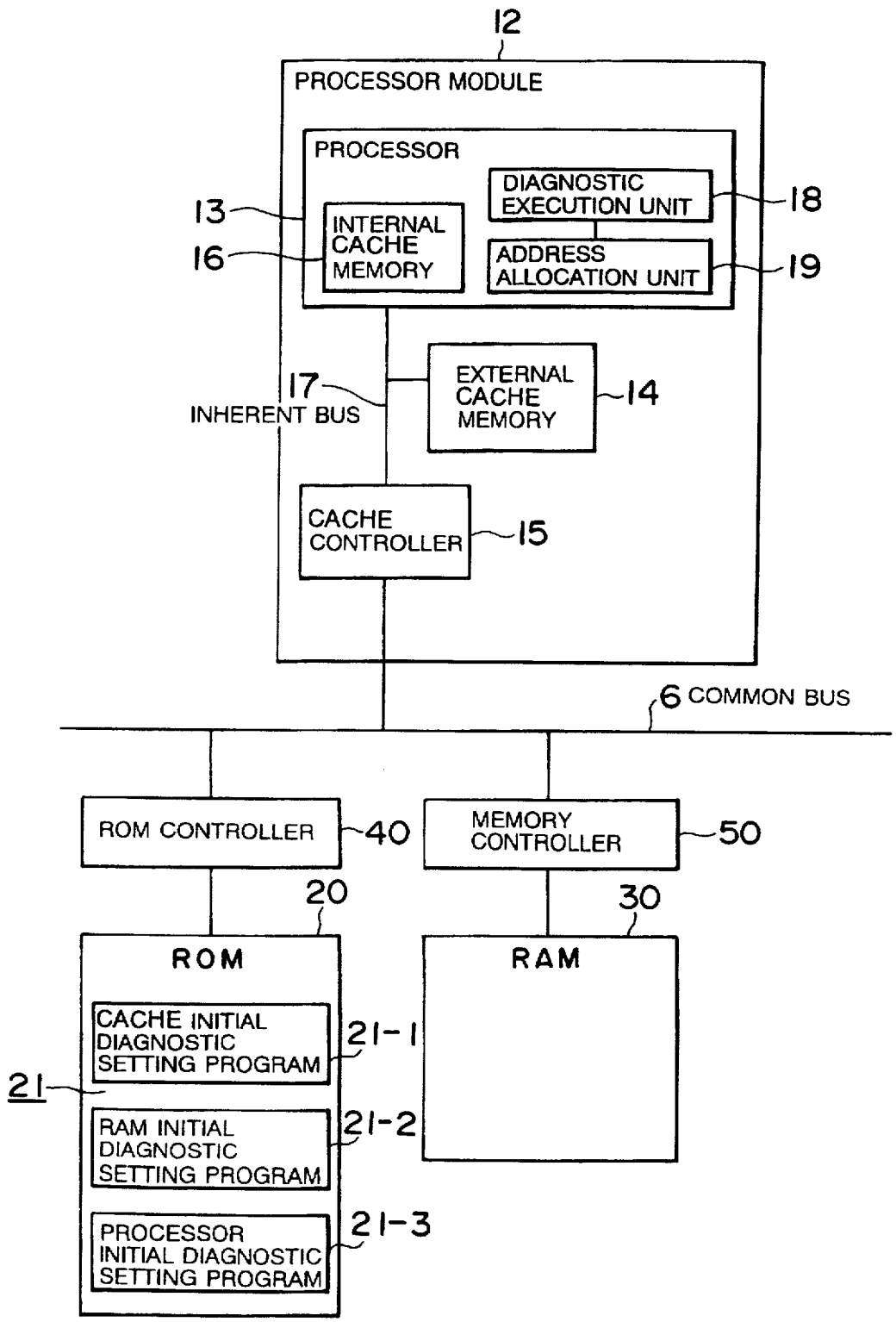
FIG. 3 is a block diagram of a device for the initial-diagnosing of processor in accordance with the second embodiment of the present invention.

The second embodiment of the present invention will now be described. FIG. 3 is a block diagram of a device for the initial-diagnosing of processors in accordance with the second embodiment of the present invention.

The device for initial-diagnosing processors comprises a processor module 12 connected to a common bus 6, a ROM controller 40 connected to the common bus 6, a ROM 20 connected to the ROM controller 40, a memory controller 50 connected to the common bus 6 and a random access memory (RAM) 30 connected to the memory controller 50.

The processor module 12 comprises a processor 13 which is connected to an inherent bus 17 and executes a process, an external cache memory 14 connected to the inherent bus 17 and a cache controller 15 connected to the inherent bus 17.

The processor 13 comprises an internal cache memory 16, a diagnostic execution unit 18 and an address allocation unit 19 connected to the diagnostic execution unit 18. Hereupon, although the address allocation unit 19 is installed within the processor 13, it also can be installed outside of the processor 13.

The diagnostic execution unit 18 reads the initial diagnostic setting program 21 stored in the ROM 20 into the external cache memory 14 and executes the initial diagnostic setting program in the external cache memory 14.

The address allocation unit 19 allocates the addresses of the processor 13 by making the addresses of the processor 13 correspond to the addresses of the external cache memory 14. The construction of the address allocation unit 19 is shown in FIG. 4. As shown in FIG. 4, the addresses of the processor 13 are the same as those of the external cache memory 14.

The cache controller 15 puts the initial diagnostic setting program 21 in the internal cache memory 16 within the processor and in the external cache memory 14 under the control of the processor 13.

The external cache memory 14 is a small-capacity and high-speed memory, and transmits the data corresponding to the address to the processor 18 by executing a cache hit, when the same addresses as those of the processor exist within the external cache memory 14. Besides, the external cache memory 14 reads the data from the RAM 30 by executing an address conversion, when the same addresses as those of the processor do not exist within the external cache memory 14.

The ROM controller 14 controls the ROM 20, and ROM 20 stores a cache initial diagnostic setting program 21-1 which diagnoses and sets the external cache memory 14 as the initial diagnostic setting program 21, a RAM initial diagnostic setting program 21-2 which diagnoses and sets the RAM 30 and a processor initial diagnostic setting program 21-3 which diagnoses and sets the processor 13.

The initial diagnostic setting program 21 diagnoses whether or not a hardware is operating normally, loads a system stored in a hard disk and a tape on RAM (main storage memory) and creates an environment in which the system can be operated by using a cache function.

The memory controller 50 controls the RAM 30, and the RAM 30 is used as a main storage memory.

Figure 5:
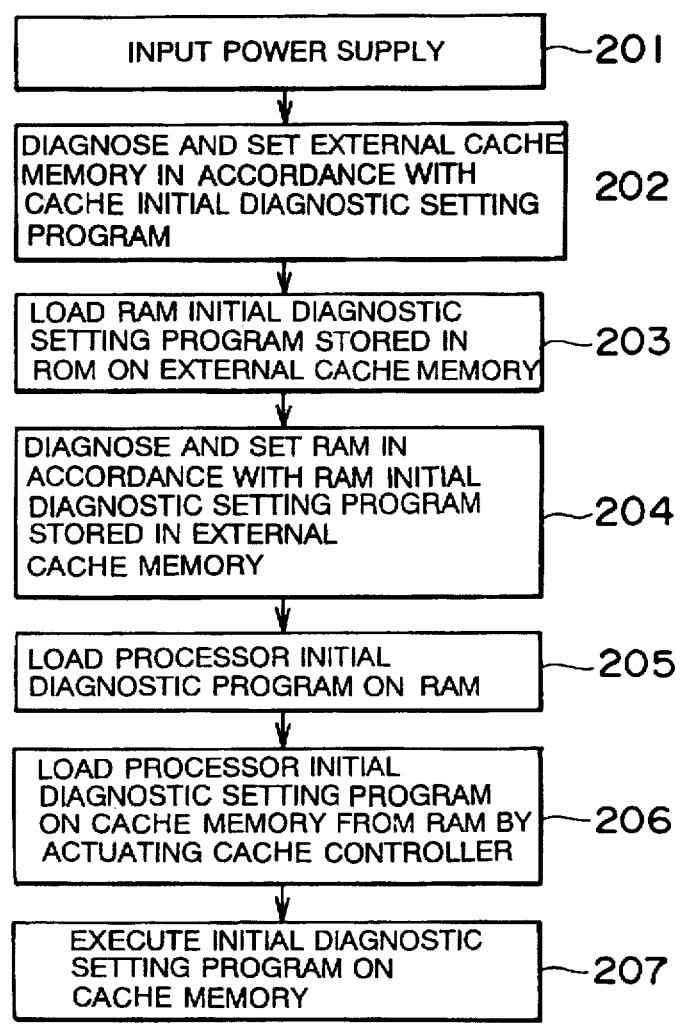
FIG. 5 is a flowchart indicating a method for the initial-diagnosing of processors of the second embodiment.

Then, the method for initial-diagnosing processors of the second embodiment constructed in the above-mentioned way will be described by referring to the drawings. FIG. 5 is a flowchart indicating the method for initial-diagnosing processors.

First of all, an unillustrated power supply is inputted (Step 201). After that, the diagnostic execution unit 18 installed within the processor 13 diagnoses and sets the external cache memory 14 by using the cache initial diagnostic setting program 211 stored in the ROM 20 (Step 202). Then, the diagnostic execution unit 18 confirms that the external cache memory 14 is normal.

Secondly, the address allocation unit 19 installed within the processor 13 allocates the addresses of the processor 13 by making the addresses of the processor 13 correspond to the addresses of the external cache memory 14. Then, the diagnostic execution unit 18 loads the RAM initial diagnostic setting program 21-2 stored in the ROM 20 on the external cache memory 14 (Step 203).

After that, the diagnostic execution unit 18 installed within the processor 13 diagnoses and sets the RAM 30 by using the RAM initial diagnostic setting program 21-2 loaded on the external cache memory 14 (Step 204).

Further, the diagnostic execution unit 18 installed within the processor 13 loads the processor initial diagnostic setting program 21-3 on the RAM 30, when the diagnosis and setting of the RAM 30 is completed (Step 205).

Then, the diagnostic execution unit 18 installed within the processor 13 switches the cache function ON, by actuating the cache controller 15 (Step 206), and loads the processor initial diagnostic setting program 12-3 on the internal cache memory 16 or the external cache memory 14 and thereafter executes the program (Step 207).

As mentioned hereinbefore, the address allocation unit 19 allocates the addresses of the processor 13 by making them correspond to the addresses of the cache storage unit 14, and the diagnostic execution unit 18 reads the initial diagnostic setting program 21 stored in the ROM 20 directly into the external cache memory 14 and executes the program. Accordingly, the processes can be executed at a high speed. Deteriorations of efficiency due to the competition in the common bus 6 does not occur, since the external cache memory 14 installed within the processor module 12 is accessed by the processor 13.

Further, the processing speed in which the diagnostic execution unit 18, installed within the processor 13, diagnoses and sets the main storage memory 30, using the initial diagnostic setting program 21, will be faster than the processing speed in which the main storage memory 30 is diagnosed and set by the initial diagnostic setting program 21 stored in the ROM 20 as in the past.

<EMBODIMENT 3>

Figure 6:
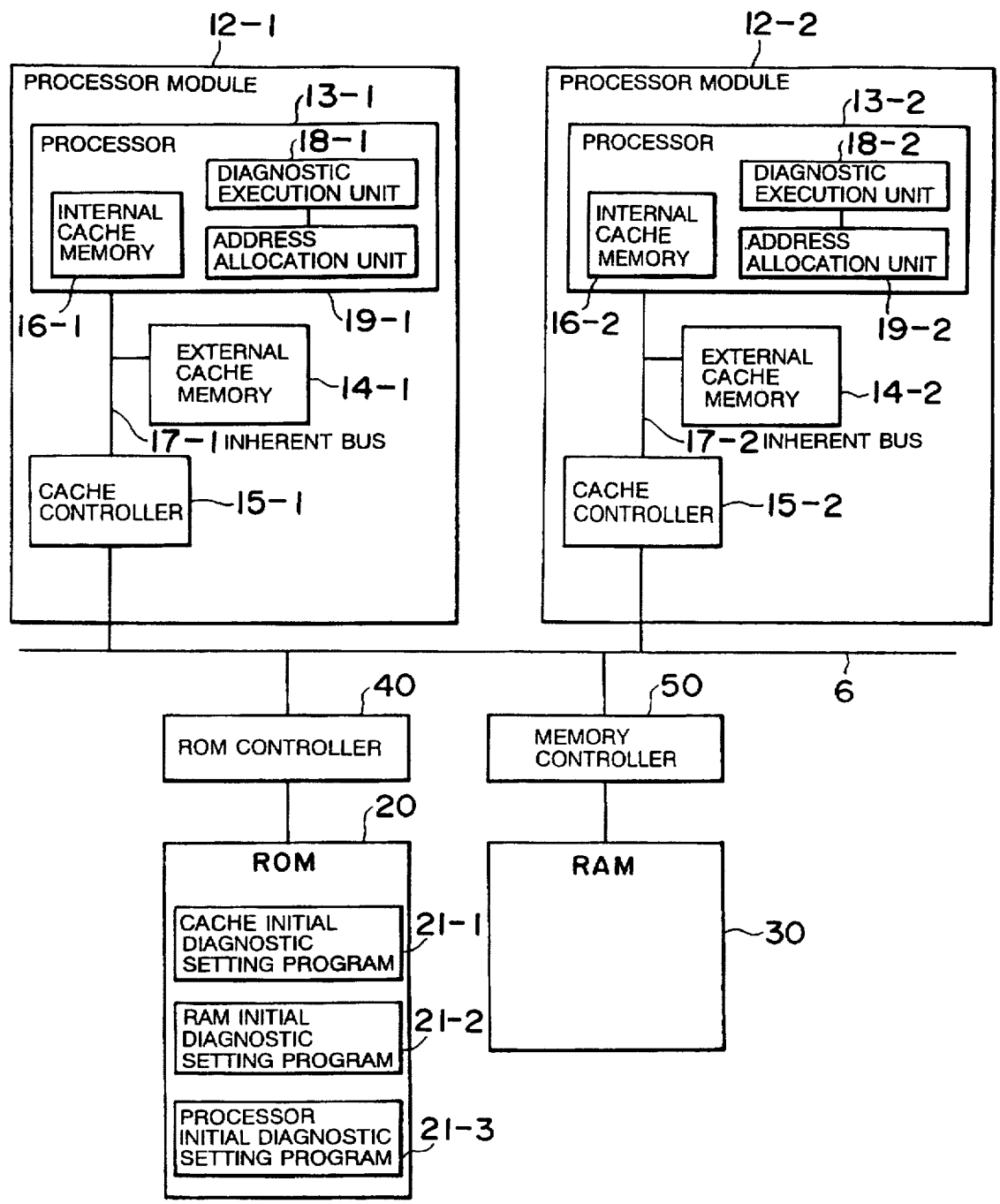
FIG. 6 is a block diagram of a device for the initial-diagnosing of processor in accordance with the third embodiment of the present invention.

The third embodiment of the present invention will now be described. FIG. 6 is a block diagram of a device for the initial-diagnosing of processors in accordance with the third embodiment of the present invention.

The device for the initial-diagnosing of processors comprises two processor modules 12-1 and 12-2 connected to a common bus 6, a ROM controller 40 connected to the common bus 6, a ROM 20 connected to the ROM controller 40, a memory controller 50 connected to the common bus 6 and a RAM 30 connected to the memory controller 50.

In the multiprocessor system, the two processor modules 12-1 and 12-2 execute a parallel processing through the common bus 6. The processor 13-1 operates as a master processor and the processor 13-2 operates as a slave processor.

A processor module 12-i (i=1-2) comprises a processor 13-i which is connected to an inherent bus 17-i and executes the process, an external cache memory 14-i connected to the inherent bus 17-i and a cache controller 15-i connected to the inherent bus 17-i.

The processor 13-i comprises an internal cache memory 16-i, a diagnostic execution unit 18-i and an address allocation unit 19-i connected to the diagnostic execution unit 18-i.

The diagnostic execution unit 18-i reads the initial diagnostic setting program 21 stored in the ROM 20 into the external cache memory 14-i and executes the initial diagnostic setting program 21 in the external cache memory 14-i.

The address allocation unit 19-i allocates the addresses of the processor 13 by making the addresses of the processor 13 correspond to the addresses of the external cache memory 14-i.

The cache controller 15-i puts the initial-diagnostic setting program 21 in the internal cache memory 16-i within the processor and in the external cache memory 14-i under the control of the processor 13-i.

The constructions of the external cache memory 14-i are the same as those of the external cache memory 14 of the embodiment 2, so the description about them will be omitted hereupon.

The cache initial diagnostic setting program 21-1, the RAM initial diagnostic setting program 21-2 and the processor initial diagnostic setting program 21-3 are stored in the ROM 20.

Figure 7:
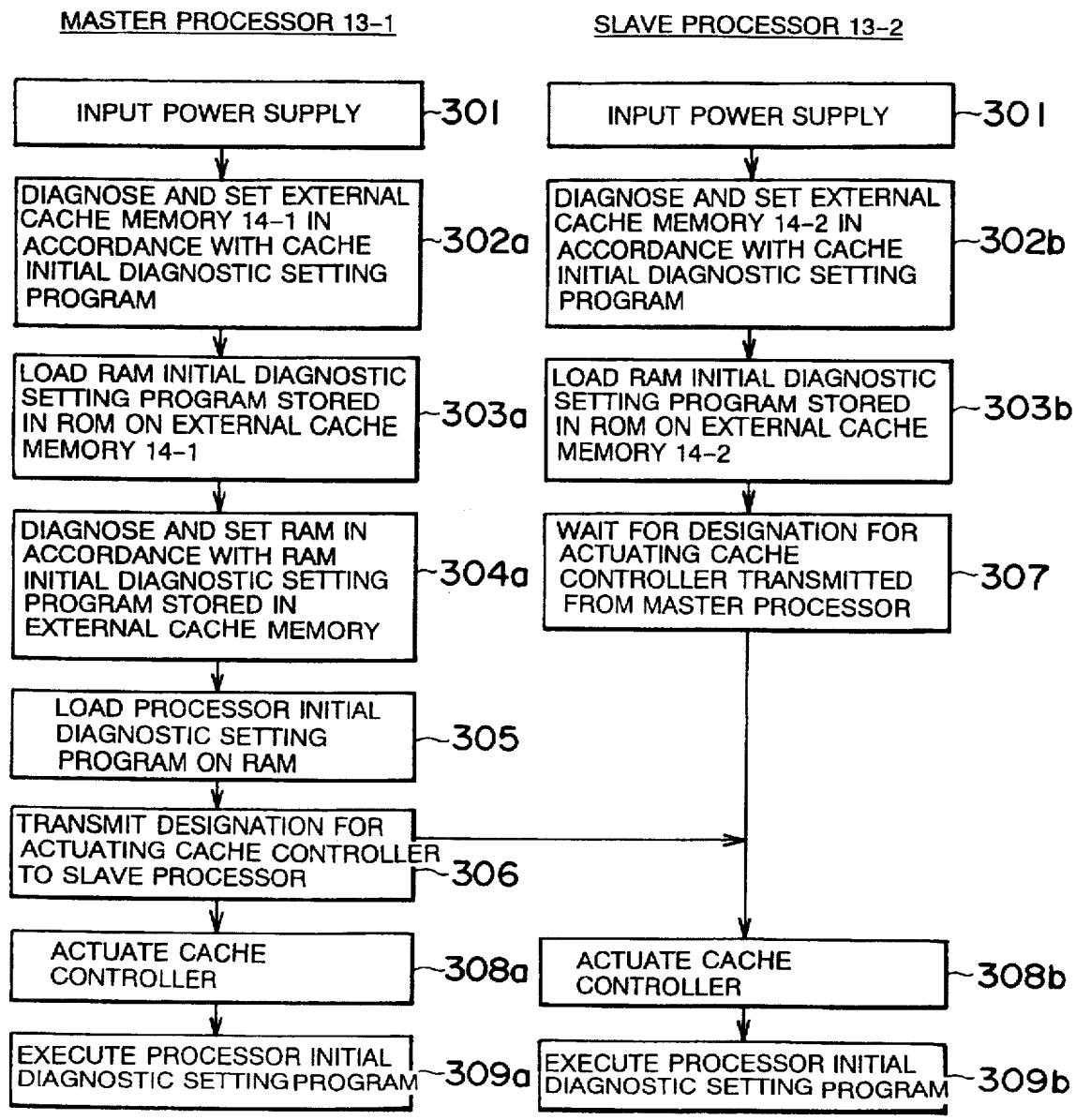
FIG. 7 is a flowchart indicating a method for the initial-diagnosing of processors of the third embodiment.
Figure 8:
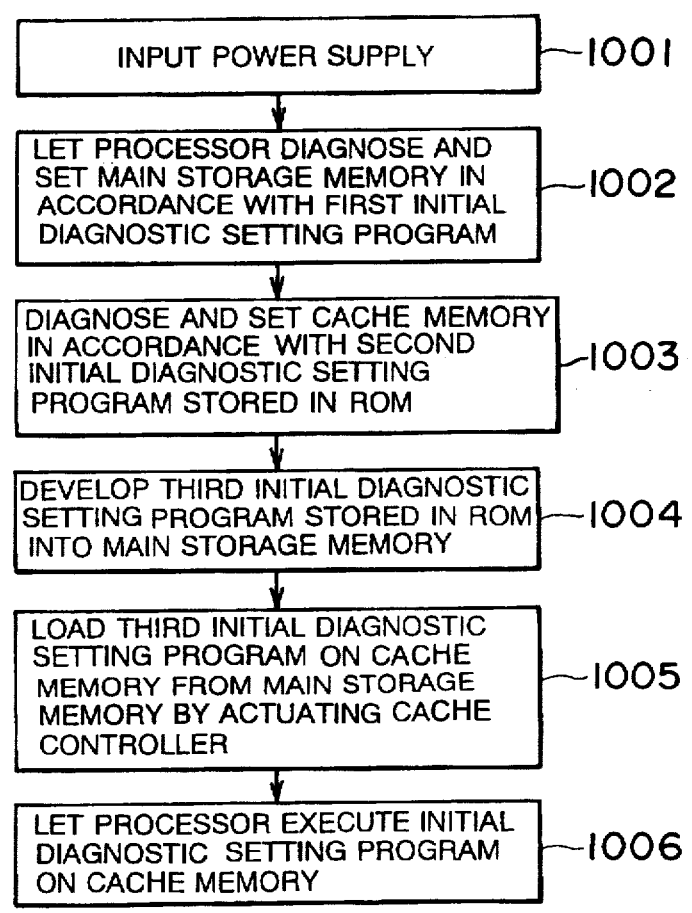
FIG. 8 is a flowchart indicating an example of known methods for the initial-diagnosing of processors.

The operations of the third embodiment constructed in the above-mentioned way will be described by referring to the drawings. FIG. 7 is a flowchart indicating a method for the initial-diagnosing of processors.

First of all, an unillustrated power supply is inputted (Steps 301a and 301B). After that, the diagnostic execution unit 18-1 installed within the master processor 13-1 and the diagnostic execution unit 18-2 installed within the slave processor 13-2 diagnoses and sets the external cache memory 14 by using the initial diagnostic setting program stored in the ROM 20 (Step 302a and Step 302b).

Secondly, the address allocation units 19-1 and 19-2 allocate the addresses of the processors 13-1 and 13-2 by making the addresses of the processors correspond to the addresses of the external cache memories 14-1 and 14-2.

Then, the diagnostic execution units 18-1 and 18-2 load the RAM initial diagnostic setting program 21-2 stored in the ROM 20 on the external cache memories 14-1 and 14-2 (Step 303a and Step 303b).

After that, the diagnostic execution unit 18-1 installed within the processor 13-1 diagnoses and sets the RAM 30 by using the RAM initial diagnostic setting program 21-2 loaded on the external cache memory 14-1 (Step 304).

Further, the diagnostic execution unit 18-1 installed within the processor 13-1 loads the processor initial diagnostic setting program 21-3 on the RAM 30, when the diagnosis and setting of the RAM 30 are completed (Step 305).

The diagnostic execution unit 18-1 installed within the processor 13-1 transmits a designation for actuating the cache controller 15-2 to the slave processor 13-2 (Step 306).

On the other hand, the diagnostic execution unit 18-2 installed within the slave processor 13-2 waits for the designation for actuating the cache controller 15-2 transmitted from the processor 13-1 (Step 307). The diagnostic execution unit 18-2 actuates the cache controller 15-2 after receiving the designation (Step 308b).

Besides, at the same time, the diagnostic execution unit 18-1 installed within the processor 13-1 switches the cache function ON, namely, actuates the cache controller 15-1 (Step 308a). The diagnostic execution units 18-1 and 18-2 load the processor initial diagnostic setting program 12-3 on the external cache memories 14-1 and 14-2 and execute the program (Step 309a and Step 309b).

As mentioned hereinbefore, the diagnostic execution units 18-1 and 18-2 will read the initial diagnostic setting program 21 stored in the ROM 20 directly into the eternal cache memories 14-1 and 14-2 and execute the program, even if the multiprocessor system is composed of two processor modules. Accordingly, the processes can be executed at a high speed.

The master processor 13-1 actuates its external cache memory 14-1 and transmits a designation for actuating the eternal cache memory 14-2 to the slave processor 13-2.

Accordingly, the slave processor 13-2 does not have to load the common bus 6 until the designation reaches the slave processor 13-2.

What is claimed is:

1. A computer comprising:
   a processor connected to a common bus;
   a cache storage connected to the processor;
   a main storage connected to the processor;
   an auxiliary storage, connected to the common bus, storing a cache storage test program, a main storage test program and a processor test program; and wherein the processor reads and executes the cache storage test program from the auxiliary storage, transfers the main storage test program to the cache storage and subsequently executes the main storage test program, and transfers the processor test program to the main storage and subsequently executes the processor test program.

2. A computer according to claim 1, further comprising:

a cache controller connected to the common bus; and wherein the processor transfers the processor test program to the main storage, instructs the cache controller to store the processor test program stored in the main storage into the cache storage such that the processor test program stored in the cache storage is executed by the cache controller.

3. A computer comprising:

a plurality of processor modules, each processor module having a processor and cache storage connected to the processor, each processor module being connected to a common bus;

a main storage, connected to the common bus;

an auxiliary storage connected to the common bus, storing a cache storage test program, a main storage test program and a processor test program; and wherein the processor of one of the plurality of processor modules reads the cache storage test program from the auxiliary storage and subsequently executes the cache storage test program, transfers the main storage test program into the cache storage and subsequently executes the main storage test program, and instructs the processor of each of the other processor modules to read the processor test program stored in the main storage and subsequently executes the processor test program.

4. A computer according to claim 3, wherein each of the processor module further comprises a cache controller connected to the common bus; and wherein the processor of one of the plurality of processor modules transfers the processor test program to the main storage, instructs the processor of each of the other processor modules to command the respective cache controllers to transfer the processor test program stored in the main storage into the cache storage of each respective processor module, and lets each respective cache controller store the processor test program stored in the main storage into each respective cache storage and executes the processor test program.

5. A processor test method comprising:

reading a cache storage test program from an auxiliary storage;

executing the cache storage test program;

transferring a main storage test program from the auxiliary storage to a cache storage;

executing the main storage test program;

transferring the processor test program from the auxiliary storage to the main storage; and executing the processor test program.

6. A processor test method comprising:

reading a cache storage test program from an auxiliary storage;

executing the cache storage test program;

transferring a processor test program from the auxiliary storage to a main storage;

instructing a cache controller to store the processor test program, stored in the main storage, into a cache storage; and executing the processor test program stored in the cache storage.

7. A processor test method comprising:

reading, using a processor of one of a plurality of processor modules, a cache storage test program from an auxiliary storage;

executing the cache storage test program;

storing a main storage test program from the auxiliary storage into a cache storage;

executing the main storage test program; and instructing the processor of each of the other processor modules to read the processor test program stored in a main storage and execute the processor test program.

8. A processor test method comprising:

reading, using a processor of one of a plurality of processor modules, a cache storage test program from an auxiliary storage, executing the cache storage test program;

storing a main storage test program from the auxiliary storage into a cache storage;

executing the main storage test program;

instructing the processor in each of the other processor modules to read the processor test program stored in a main storage and execute the processor test program; and letting the cache controller associated with the one processor module store the processor test program, stored in the main storage, into the cache storage of the one processor module and execute the processor test program.

* * * * *